Figure 1:
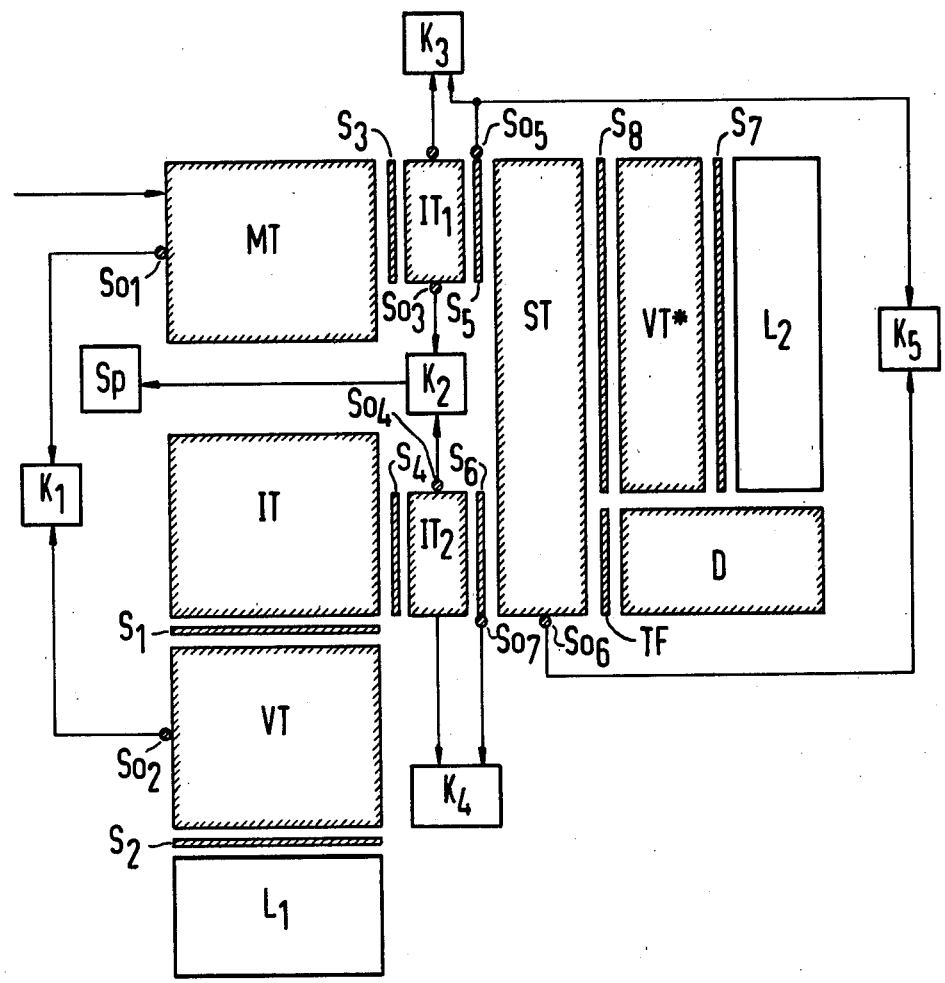

United States Patent [19]

Bardl

[11] 4,399,518

[45] Aug. 16, 1983

[54] MONOLITHICALLY INTEGRATED SEMICONDUCTOR CIRCUIT

[75] Inventor: Artur Bardl, Munich, Fed. Rep. of Germany

[73] Assignee: Siemens Aktiengesellschaft, Berlin and Munich, Fed. Rep. of Germany

[21] Appl. No.: 182,236

[22] Filed: Aug. 28, 1980

[30] Foreign Application Priority Data

Aug. 30, 1979 [DE] Fed. Rep. of Germany ....... 2935107

[51] Int. Cl.³ ........................................... G11C 13/00
[52] U.S. Cl. ................................. 365/45; 340/347 AD
[58] Field of Search .................. 340/347 AD; 365/45

[56] References Cited

U.S. PATENT DOCUMENTS 4,072,939 2/1978 Heller et al. ................ 340/347 AD
4,144,588 3/1979 Goettler et al. .................... 365/183

Primary Examiner—Terrell W. Fears
Attorney, Agent, or Firm—Herbert L. Lerner; Laurence A. Greenberg

[57] ABSTRACT

Monolithically integrated semiconductor circuit with a signal input addressable by a first signal type, constituting analog signals, and with a signal output delivering a second signal type, constituting digital signals, including a circuit section for converting the analog signals of the first signal type into the digital signals of the second signal type, the circuit section being a charge transport circuit forming an analog adder.

19 Claims, 2 Drawing Figures

MONOLITHICALLY INTEGRATED SEMICONDUCTOR CIRCUIT

The invention relates to a monolithically integrated semiconductor circuit with a signal input addressable by a first signal type, and with a signal output delivering a second signal type, as well as with a circuit section effecting conversion of signals of the first signal type into signals of the second signal type and formed by a charge transport circuit, and wherein analog signals are used as one of the signal types and digital signals as the other signal type.

Such semiconductor circuits are either analog-to-digital converters or digital-to-analog converters and can be constructed on the basis of different operating principles. One circuit of this type is described in German Published Non-Prosecuted Application (DE-OS) No. 27 08 636. It is an object of the invention to provide a new circuit of this general type.

According to the invention, and with the foregoing object in view, it is proposed for this purpose that the circuit section, which effects the conversion of signals of the first signal type into signals of the second signal type, be a charge transport circuit formed as an analog adder.

Details regarding charge transport circuits, especially regarding CCD systems, are described, for example, in "Der Elektroniker" No. 2/1978, page EL 1-EL 6 and No. 3/1978, page EL 7-EL 14. Such charge transport circuits are used, for example, as clock-controlled shift registers or as electronic filters and are constructed accordingly. They are formed preferably of an n-doped zone of a silicon single crystal, the surface of which is covered with a thin $SiO_2$ layer, which serves as support of a number of gate electrodes. Each of these gate electrodes forms, with the aforementioned n-doped zone of the silicon single crystal, an MOS capacitor having a first terminal formed by the corresponding gate electrode and a second terminal by an electrode contacting the aforementioned zone of the silicon single crystal without barrier.

It is essential for the operation of a CCD system that the gate electrodes defining the individual MOS capacitors be arranged so closely behind one another on the $SiO_2$ layer that the depletion zone of the one capacitor can extend into the zones of the silicon crystal under the respective adjacent gate electrodes and therefore of the MOS capacitor formed thereby. When the voltage at the one capacitor is switched off, the charge can then flow off into the adjacent capacitor to which voltage is applied at the same instant. This means that the gate electrodes of the MOS capacitors, which are arranged in a row on the silicon crystal, are controlled by clock pulses in such manner that the charge transport occurs in succession through the chain of MOS capacitors from the signal input to the signal output.

The charge source corresponds to the "source" and the output section to the "drain" of an MOS field-effect transistor of the enhancement type. The gate electrodes of the MOS capacitors of the CCD system, which are located between the charge source and the output section, control the channel situated between the charge source and the output section sectionwise.

The first gate electrodes adjacent to the charge source, and the MOS capacitors defined thereby generate charge packets in accordance with an analog signal between the charge source and the semiconductor zone of the MOS capacitors, and in accordance with a sampling frequency in such a manner, that the magnitude of the respectively produced charge packets corresponds to the respective value of the amplitude of the analog signal. These charge packets are transfered to the clock-controlled MOS capacitors, which belong to the CCD chain per se. Each of these MOS capacitors of the CCD chain carries an electric charge which corresponds to the amplitude value of the analog signal obtained by the sampling. Since the sampling frequency is chosen high enough in accordance with the Nyquist theorem, so that the analog signal can be restored to its original shape with the required accuracy due to the sampling of the charge pockets obtained in the time sequence thereof, all of the information obtained on the basis of the applied analog signal travels, in the course of the operation of such a CCD system, across every electrode of the CCD system, which can therefore be made the starting point of a device according to the invention.

Accordingly, in a first preferred embodiment of the semiconductor circuit according to the invention, a signal input, analog-addressed with subsequent signal processing i.e. a sampler with following filter function (low pass), is provided as the input section. This input section is constructed in a manner customary to CCD systems. Furthermore, a sample-and-hold member is provided as the first MOS capacitor, which is referred to hereinafter as "the measuring cup". This measuring cup serves for receiving the individual charge packets delivered by the signal sampler.

A second MOS capacitor, hereinafter referred to as "inverter cup" and having the same size as the measuring cup is coupled via a gate-controlled first threshold to a third MOS capacitor of the same size, referred to hereinafter as the "doubler cup", which is connectible, in turn, via a gate-controlled second threshold to a first charge source formed as a diffusion zone i.e. as a "source". Finally, the first MOS capacitor as well as the second MOS capacitor, also, are connected, via a clock-controlled threshold, respectively, to an MOS capacitor, which is smaller by a factor 1/16. These two smaller MOS capacitors are referred to hereinafter as "identification cups". Each of these two identification cups is connected via a gate-controlled threshold, respectively, to a common further MOS capacitor, the "summing cup" which forms the core of the circuit and has a size corresponding to the size of the measuring cup. This summing cup is acted upon, on the other hand, via a further gate-controlled threshold by a further MOS capacitor of the same size, the second "doubler cup", which like the first doubler cup, is connected to a second charge source via a gate-controlled threshold. Such a system operates as an analog-to-digital converter.

In one embodiment of a semiconductor circuit according to the invention serving for converting a digital signal into an analog signal, the signal input to be addressed by a digital signal, preferably based on the binary system, is provided for setting the output count of a backwards counter, which is controlled at the counting input thereof by a pulse-delivering section of the semiconductor circuit. In addition, this pulse-delivering circuit section controls the generation of charge packets of equal size, which come from a charge source and are fed via a charge transport system to the part of the system which is formed as an analog adder, and corresponds to the summing cup in the first embodiment of the invention. The total number of charge packets fed to the part of the system formed as an analog adder is determined by the magnitude of the respectively instanteneously present signal. The output of the analog adder, which is provided, in particular, also by an MOS capacitor controlled by a sample-hold member, controls the signal output of the semiconductor acting as a digital-to-analog converter.

Other features which are considered as characteristic for the invention are set forth in the appended claims.

Although the invention is illustrated and described herein as embodied in monolithically integrated semiconductor circuit, it is nevertheless not intended to be limited to the details shown, since various modifications and structural changes may be made therein without departing from the spirit of the invention and within the scope and range of equivalents of the claims.

Figure 2:
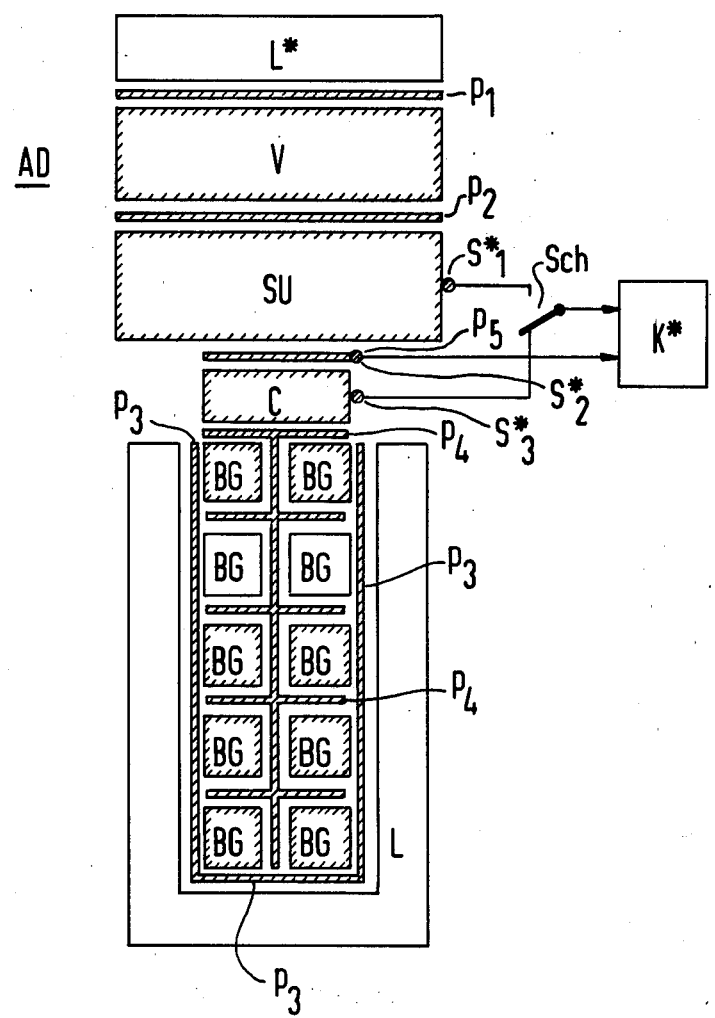

The contruction and method of operation of the invention, however, together with additional objects and advantages thereof will be best understood from the following description of specific embodiments when read in connection with the accompanying drawing, in which, FIG. 1 is a diagrammatic and schematic view of the very heart of a semiconductor circuit serving as an analog-to-digital converter is shown in accordance with the invention; and FIG. 2 is a view similar to that of FIG. 1 of the heart of a semiconductor circuit according to the invention serving as a digital-to-analog analog converter.

Since the size and construction of the MOS capacitors forming the individual components of the semiconductor circuit are determined by their gate electrodes, it is believed to be sufficient to illustrate the MOS capacitors by the outlines of the gate electrodes thereof. The same applied to the thresholds or transfer gates provided between the MOS capacitors, and to the charge sources.

In the semiconductor circuit according to the invention shown in FIG. 1, the charge packets which are generated due to an analog signal input by means of a sampler conventional in CCD systems and operating with a sampling frequency $f_A$, the charge packets representing the amplitude values of the signal present, arrive in the order of generation thereof in the first MOS capacitor i.e. the measuring cup MT to which a suitable voltage is applied for this purpose. Thus, the measuring cup MT is a part of a conventional charge transport system i.e. a CCD device. The gate forming the measuring cup MT is at a potential matched to the clock signals of the sampler, and the frequency $f_A$ thereof, which is maintained after respective receipt of a charge packet unti the comparison charge, which is to be passed on to the summing cup ST together with the respective charge content of the measuring cup MT, has been built up in inverter cup IT. Thus, the measuring cup represents the sample-and-hold circuit of the analog-to-digital converter according to FIG. 1.

In order to provide the necessary comparison possibilities between the individual charge packets and comparison charges, measuring probes for the surface potentials of the MOS capacitors and some thresholds as well as of the comparators permitting the respective comparison are provided. It should further be noted that, in this case also, the so-called base charge operation is used, so that a charge remains in the old MOS capacitor for each of the charge transport processes, which is then replaced by the base charge in the new MOS capacitor to the signal charge packet reduced by the amount of a base charge.

With respect to the aforementioned measuring probes and comparators, it should be stated with respect to a system according to the invention, that the measuring probes, for example the measuring probe in the vicinity of the measuring cup MT, is provided by a respective barrier-free contact of the semiconductor surface. The probe assigned to the measuring cup is the probe $S_{O1}$. The measuring probes have the function of determining, at the location thereof, for example in the case of the probe $S_{O1}$ at the measuring cup MT, the surface potential $\phi s$ which adjusts itself on the semiconductor surface due to the respectively stored charge, in accordance with the equation $$\phi s = U_g + Q_s/C_o - U_{FB}$$

wherein
$U_g$=voltage between the respective gate and the barrier-free terminal of the semiconductor zone forming the MOS capacitors;
$Q_s$=total charge per unit area, which is contained within the respective space charge zone;
$C_o$=oxide capacity per unit area; and
$U_{FB}$=flat band voltage The probe $S_{O1}$ controls a comparator $K_1$ in accordance with the determined value of the surface potential $\phi s$. It should further be noted that, at the surface of the semiconductor zone at the doubler cup VT, a second probe $S_{O2}$ is provided for determining the value of the surface potential $\phi s$ which adjusts itself due to the charge flowing into the doubler cup; this surface potential acts on the reference input of the comparator $K_1$.

The second MOS capacitor in the semiconductor circuit shown in FIG. 1 according to the invention is the inverter cup IT, which is defined by the gate electrode thereof in the vicinity of the measuring cup MT. The gate electrode defining the inverter cup IT has the same area as the gate electrode of the measuring cup and is made under the same conditions as the latter. This also applies to the third MOS capacitor, i.e. the gate electrode defining the first doubler cup VT.

While these gate electrodes are constructed so that no charge transfer between the measuring cup MT and the inverter cup IT is possible, such a transfer between the first doubler cup VT and the inverter cup IT is provided via a threshold $S_1$. The gate electrodes defining this threshold $S_1$ and also the further thresholds in contrast to the gate electrodes defining the MOS capacitors, are constructed in a conventional manner, so that, while the threshold can control and, in particular, also cut off the charge flow between the MOS capacitors controlled thereby, i.e. as an example between the first doubler cup VT and the inverter cup IT, it practically stores no charge, on the other hand, due to the small area thereof and therefore does not act as an MOS capacitor.

A further threshold $S_2$ is located between the doubler cup VT and a first charge source $L_1$. The latter is realized by a diffusion zone of conduction type opposite that of the semiconductor zone forming the MOS capacitors i.e. in the case of the example of the $p^+$ type, which is provided with a barrier-free contact in the same manner as the source zone of an MOS field-effect transistor.

For the transfer of the charge from the first charge source $L_1$, the gate of the first doubler cup VT is disposed simultaneously with or immediately after the receipt of a charge packet in the measuring cup MT, at the potential of the gate of the measuring cup MT. The connection of the charge source $L_1$ approaches, in this regard, the voltage value of 0 volt, so that with the threshold $S_2$ open, an amount of charge flows into the doubler cup VT, which is much larger than the signal charge in the measuring cup MT.

After this charge is filled into the first doubler cup VT, with the threshold $S_2$ open, the potential at the terminal of the first charge source $L_1$ is brought back to the value of the potential present at the gate of the first doubler cup VT, so that excess charge flows back into the charge source $L_1$. In the first doubler cup VT, a quantity of charge then remains which exactly corresponds to the sum of twice the base charge and the charge packet in the measuring cup MT present for maximum signal amplitude. After the charge between the first doubler cup VT and the first charge source $L_1$ is equalized, the threshold $S_2$ is closed and the possibility is provided for transfering an amount of charge corresponding to the base charge from the doubler VT to the inverter cup IT.

Different possibilities exist for this purpose. The simplest way to accomplish this purpose is now to bring the heretofore non-participating gate of the inverter cup IT to the potential of the gate at the measuring cup MT and at the first doubler cup VT, and thereby to provide the possibility of a charge input from the doubler cup VT into the inverter IT via the threshold $S_1$ (which must be opened, at the latest, at this instant). The potential difference between the gate of threshold $S_1$ and the gate of threshold $S_2$ is adjusted so that exactly the base charge flows over from the doubler cup VT into the inverter cup IT.

On the other hand, one can also tie together from the start the gates of the MOS capacitors MT, IT and VT, and make the potential of the gate defining the threshold $S_1$ variable in such a manner that the threshold $S_1$ is opened only at the instant of the charge transfer into the inverter cup IT. Finally, it is also possible to provide, in addition to the threshold $S_1$, a transfer gate between the doubler cup VT and the inverter cup IT, so that the potential of the gate of the threshold $S_1$, which determines the amount of base charge to be transferred from the doubler cup VT to the inverter cup IT (and which can further be used for controlling the charge transfer from the inverter cup IT in direction toward the summing cup ST) can be held fast or adhered to.

If then, with the potential at the gates of the measuring cup MT, the inverter IT and the first doubler cup VT held fast or adhered to, the base charge amount is transferred to the inverter cup IT, the potential at the gates of the measuring cup MT and the doubler VT is jointly shifted in the following process step, maintaining the value of the potential at the gate of the inverter cup IT, jointly in the direction toward the potential of the terminal of the semiconductor zone forming the MOS capacitors i.e. lowered, the space charge zone in the two MOS capacitors IT and VT i.e. in the measuring cup and in the doubler cup, being reduced and the surface potentials $\phi s$ of the two MOS capacitors being made equal or matched to one another.

If the state of equality of the surface potentials at the measuring cup MT and at the first doubler cup VT is attained, this means that the mobile charge in the first doubler cup VT has dropped, due to the charge transfer to the inverter cup IT that has already taken place, to the value of the mobile charge in the measuring cup MT, and therefore to the actual value of the signal. This means that, because of the joint lowering of the potential at the gates of the measuring cup MT and the doubler cup VT, so much mobile charge has been surrendered from the doubler cup VT to the inverter cup IT, hat the inverter cup contains, in addition to the base charge, a further amount of charge which is equal to the difference of the amount of charge associated with a maximum signal amplitude and the mobile charge representing the actual signal value in the measuring cup MT, and can be associated for this reason with the inverted or complementary signal.

The attainment of this condition is determined or ascertained, via the two potential measuring probes $So_1$ and $So_2$, in the comparator $K_1$. Immediately upon reaching this state, the charge transfer from the doubler cup VT into the inverter cup IT is abruptly terminated through the action of the comparator $K_1$, for example by raising the threshold $S_1$ and by switching-off the potential at the gate of the threshold $S_1$, respectively, so that from then on the inverter cup IT carries the base charge and the charge corresponding to the inverted signal.

The gate of the first doubler cup VT is then disconnected from the potential of the gate of the measuring cup MT. The latter potential is then raised again to the original value. Then, the gate of the inverter cup IT (which has the same potential) is connected to the gate of the measuring cup MT.

In the next step, a comparison between the charge content of the measuring cup MT and the charge content of the inverter cup IT is performed. To this end, the measuring cup MT is connected via a gate-controlled threshold $S_3$ to the first identification cup $IT_1$, and the inverter cup IT is connected via a further gate-controlled threshold $S_4$ to the second identification cup $IT_2$.

Both identification cups $IT_1$ and $IT_2$ have the same area and the same history of preparation. The area thereof is one sixteenth of the area of the gate electroded defining the other MOS capacitors of the device.

Each of the two identification cups $IT_1$ and $IT_2$ is coupled to a second comparator $K_2$ via a probe $So_3$ and $So_4$, respectively, provided for ascertaining the respective surface potential $\phi s$. The comparator $K_2$ has the objective of determining whether the charge in the measuring cup MT or the charge in the inverter cup IT is greater. To the first one of these two states, the sign "+" is assigned and to the second state, the sign "−".

The simplest approach, in this regard, is to connect the gate determining the threshold $S_4$ to the gate of the threshold $S_3$. The thresholds $S_3$ and $S_4$ are then controlled by the same potential. In order to make the comparison, the potential of the gate defining the measuring cup MT and of the gate which is connected to the first-mentioned gate and defines the inverter cup IT, is shifted in the direction toward the potential of the terminal of the semiconductor zone containing the MOS capacitors of the device. Because the two thresholds $S_3$ and $S_4$ have the same adjustment, charge flows first into the associated identification cup $IT_1$ and $IT_2$, respectively, from that of the two MOS capacitors MT and IT, which contains the greater amount of charge. The flowing-off charge therefore penetrates either into the first identification cup $IT_1$ or into the second identification cup $IT_2$. Thereby, the surface potential $\phi s$ of the respective identification cup is altered and, accordingly, the previously existing state of equality of the operating states of the two probes $S_{o3}$ and $S_{o4}$ is disturbed, so that the comparator $K_2$ responds. At the instant of response of the comparator $K_2$, the process of potential-shifting at the gate electrodes defining the measuring cup MT and the inverter cup IT is abruptly terminated.

The response of the second comparator $K_2$ indicates that the content of mobile charge in the measuring cup MT is either greater or less then one-half of the signal width available for the input of the circuit. The state "138 is assigned to the first case and the state "0" to the second case. The occuring case, respectively, i.e. the operating state of the second comparator $K_2$ corresponding thereto, controls the behavior of a storage cell Sp, which is assigned to the most significant bit of the existing analog-to-digital converter in such a manner that, in the first case a logic al "1" and in the second case a logic al "0" is stored as the highest binary digit of the result.

Immediately thereafter, a potential at the gates of the measuring cup MT and the inverter cup IT is shifted further, in the previous manner, in direction toward the potential of the terminal of the semiconductor zone of the MOS capacitors, that one of the two MOS capacitors MT and IT, which has caused the response of the comparator $K_2$, surrendering further charge to the identification cup assigned thereto, until the other one of the two identification cups $IT_1$ and $IT_2$ also begins to receive charge from the MOS capacitor associated therewith. Immediately with the start of the charge absorption by the other identification cup, a so-called charge detection process is initiated via the measuring probe for determining the surface potential $\phi s$ associated with the other identification cup.

If the hereinafore described case applies, that a "1" is stored in the memory Sp, the probe $S_{o4}$ indicated that the identification cup $IT_2$ associated therewith begins to absorb charge as the last of the two identification cups $IT_1$ and $IT_2$. If, on the other hand, a "0" has been stored, then the probe $S_{o3}$ associated with the first identification cup $IT_1$ initiates the process of charge detection.

This charge detection can be accomplished by switching the input of the comparator $K_2$ from the one of the two probes $S_{o3}$ and $S_{o4}$, respectively, which initiates the charge detection process, to a reference voltage source $Q_{ref}$ (not shown in the figure), while the other probe remains connected as before to the input of the comparator $K_2$ associated therewith. The reference voltage source $Q_{ref}$ is so formed that its voltage corresponds to the surface voltage $\phi s$ of empty identification cups $IT_1$ and $IT_2$, respectively.

It can therefore readily be realized by an additional MOS capacitor with the size of the identification cups, the gate of which is at the same potential as the gates of the identification cups $IT_1$ and $IT_2$. If a charge appears in the other one of the two identification cups $IT_1$, $IT_2$, then the comparator $K_2$ responds, as determined, because the surface potential $\phi s$ at the respective identification cup begins to change, whereby the reduction of the voltage at the gates of the measuring cups MT and the identification cup IT is stopped.

Besides the measuring cup MT, the inverter cup IT, the first doubler cup VT and the two identification cups and possibly an MOS capacitor serving for representing the reference voltage source, the MOS capacitor ST and VT* forming the analog adder as well as a second charge source $L_2$ are provided as further MOS capacitors. In addition, the arrangement according to the invention contains two further comparators associated with the two identification cups $IT_1$ and $IT_2$ together with associated measuring probes for the surface potential $\phi s$, a further comparator controlled by the surface potentials at the threshold $S_4$ and at the summing cup ST, and finally, a decoder D, which is addressed by the summing cup via a transfer gate TF.

The first of the aforementioned further MOS capacitors is the summing cup ST. It forms the heart of the analog adder and is separated from the first identification cup $IT_1$ by a gate-controlled threshold $S_5$, and from the second identification cup $IT_2$ by a further gate-controlled threshold $S_6$. The surface potential $\phi s$ at the threshold $S_5$ serves for controlling the previously indicated comparator K. Like the summing cup ST, the second one of the further mentioned MOS capacitors, namely the second doubler cup VT*, has the same area as the summing cup ST and therefore, as the measuring cup MT. The second charge source $L_2$ is associated with the second doubler cup VT* ahd has a design and operation which corresponds to the charge source $L_1$ in the case of the first doubler cup VT. The charge transfer between the second charge source $L_2$ and the second doubler cup VT* is controlled by a threshold $S_7$, by accordingly adjusting the potential at the gate electrode thereof. Finally, there is also a gate-controlled threshold $S_8$ between the second doubler cup VT* and the summing cupt ST, and the previously mentioned transfer gate TF between the summing cup ST and the input of the decoder D.

If the gate electrode of the second identification cup $IT_2$ is then connected to the gate electrode of the first identification cup $IT_1$, and the potential of these two gate electrodes is brought close to the potential of the terminal of the semiconductor zone forming the MOS capacitors, then charge flows from the identification cup $IT_2$ via the threshold $S_6$ into the summing cup ST, if a "1" had been entered previously into the memory SP. If, on the other hand, a "0" has been entered into the memory, charge flows, due to the potential shift mentioned, from the identification cup $IT_1$ via the threshold $S_5$ into a summing cup ST.

Every time the second comparator $K_2$ responds, there is an indication based upon the explanations given hereinbefore that the same amount of charge is then present in the measuring cup MT and in the inverter cup IT, so that from then on, no further information can be derived from the charge content thereof. The charge remaining present in these two MOS capacitors MT and IT can therefore be removed in a conventional manner, for example, by suction from the two MOS capacitors MT and IT as well as from the first doubler cup VT. These MOS capacitors can thus be prepared for the processing of the next charge packet delivered by the sampler to the measuring cup MT.

It is apparent from the preceding explanations that in all cases the difference of the charges in the measuring cup MT and in the inverter cup IT is transferred to one of the identification cups $IT_1$ or $IT_2$. A distinction must be made between the case wherein the transferred charge fills out the respective identification cup completely and runs over into the summation cup ST, and the case wherein the capacity of the identification cup IT is only partially utilized by the transferred charge difference.

In this regard, the following should be noted:

Besides the comparator $K_2$, the identification cups $IT_1$ and $IT_2$ are each provided with comparator $K_3$ and $K_4$, respectively, via a probe serving for the determination of the surface potential $\phi s$ at the point of the respective identification cup (these may be the probes $S_{O3}$ and $S_{O4}$ controlling the second comparator $K_2$). The reference voltage of these two comparators $K_3$ and $K_4$ is generated by a probe $S_{O5}$ at the location of the threshold $S_5$ between the first identification cup $IT_1$ and the summing cup ST or by a probe $S_{O7}$ at the location of the threshold $S_6$ between the second identification cup $IT_2$ and the summation cup ST. Both probes $S_{O5}$ and $S_{O7}$ serve again for determining the surface potential $\phi s$ at the location of the respective threshold.

These reference voltages correspond to the largest analog value to be digitalized, for example of 3.14 dBmO with a digital decision value "4096" in the so-called "A-Law-Companding". If, for a greater signal, the first responding identification cup $IT_1$ or $IT_2$, respectively, is full, then the corresponding comparator $K_3$ or $K_4$ responds and the charge that flowed from the measuring cup MT or the inverter cup IT is conducted into the summing cup ST via the threshold $S_5$ or $S_6$, respectively. Response of one of the two comparators $K_3$ or $K_4$, respectively, indicates the presence of the first of the hereinaforementioned cases; lack of response indicates the presence of the second of these cases. They are designated hereinafter as case (a) and case (b). The further process for determining the digital value corresponding to the signal present at the signal input of the system is the same for cases (a) and (b). However, further discussion is necessary for case b0, and will be made after the summing process has been described.

For the further course of determining the digital signal corresponding to the analog signal present at the signal input of the system, it is important that the thresholds $S_5$, $S_6$ and the threshold $S_7$ lying between the charge source $L_2$ and the second doubler cup VT* be controlled by gate electrodes held at a common potential i.e. that the gate electrodes thereof be connected to one another. In addition, a probe for measuring the surface potential at the location of one of these thresholds for addressing a further comparator $K_5$ is provided, the second input of which is connected to a corresponding probe $S_{O6}$ at the location of the summing cup ST. In the case of the embodiment shown in FIG. 1, the probe $S_{O5}$, which is provided at the threshold $S_5$ for acting upon or addressing the comparator $K_3$, is connected to one input of the further comparator $K_5$.

In the evaluation of the respective charge content of the summing cup ST, the second doubler cup VT* is initially charged up. To this end, the threshold $S_7$ is opened by an appropriate voltage "4096" ($=2^{12}$) between the gate defining the threshold $S_7$ and the contact of the gate VT* forming the MOS capacitor, so that charge can flow from the second charge source $L_2$ into the second doubler cup VT*. It should be noted that the gates of the summing cup ST and of the second doubler cup VT* are connected to one another, in this regard, in order to attain the same space charge depths. In a manner similar to the charging of the first doubler cup VT, the excess charge is returned also in the case of the second doubler cup VT* from the doubler cup into the charge source $L_2$, by bringing the contact of the charge source L, with the threshold $S_7$ open, to the value of the potential of the gate electrode of the second doubler cup VT*. There then remains in the second doubler cup VT* an amount of charge which is exactly proportional to the voltage difference at the gate of the threshold $S_7$ and at the gate of the second double cup VT*.

Then, the gate voltage of the summing cup ST and the second doubler cup VT* is lowered jointly. In the process, charge which can no longer be held due to the smaller gate voltage in the second doubler cup VT*, is returned to the charge source $L_2$ via the threshold $S_7$. Due to the reduction of the voltage, the surface potential $\phi s$ at the location of the summing cup ST approaches the surface potential of the threshold $S_5$. The comparator $K_5$ addressed via the probes $S_{O5}$ and $S_{O6}$ responds, if the surface voltages are equal, and thereby stops the voltage reduction process.

What is achieved thereby is that not only the surface voltages at the location of the threshold $S_5$ and of the summing cup ST are equal, but also that the surface voltages at the threshold $S_7$ and at the second doubler cup VT* have the same value, since the gates of the threshold $S_5$ and the threshold $S_7$ are metallically connected to one another and the latter were produced by the same process step. The MOS capacitors representing the summation cup ST and the second doubler cup VT* have likewise been made in the same process step and the gates thereof are tied together. The same voltage is therefore applied to both MOS capacitors, so that the amounts of mobile charges in the equally large space charge zones are likewise equal. The charge contained in the second coubler cup VT* is now transferred to the summing cup ST by opening the threshold $S_8$ and is thus added to the charge already there. So that the charge transfer is complete, the voltage at the summing cup ST is again brought to the starting value, and the voltage at the gate of the threshold $S_7$ is reduced to the value "zero".

Following the charge transfer from the second doubler cup VT* into the summing cup ST, the threshold $S_8$ is closed again and, after voltage is applied to the gate thereof, the second doubler cup VT* is again filled with charge in a manner described hereinbefore.

Then testing is performed as to what amount of charge is contained in the summing cup ST. For this purpose, various possibilities known heretofore are available. One of them is described in German Published Non-Prosecuted Application (DE-OS) No. 27 04 711. This method calls for supplementing the heretofore described part of the system shown in FIG. 1, by adding a decoder D which has, for example, sixteen further MOS capacitors, which are separated by a respective threshold from one another and from the charge source i.e. from the summing cup ST in the case at hand, and which are arranged in chain-like manner on the oxide layer covering the semiconductor zone of the MOS capacitors. Details regarding the decoder D are available in German Published Non-Prosecuted Application (DE-OS) No. 27 04 711, so that the decoder D has accordingly been shown in FIG. 1 only as a block. The threshold located between the decoder D and the summing cup ST is designated by the reference character TF. The structure of the decoder D as seen in German Published Non-prosecuted Application (DE-OS) No. 27 04 711, is always applicable if the amount of charge to be tested or evaluated is greater than the minimum threshold "2048" ($=4096:2$).

In this example, 16 MOS capacitors of volume "128" referred to "4096" are provided in the decoder D. The gate, which defines the first of these MOS capacitors, is at the same time the transfer gate TF for the charge of the summing cup ST which then may fill further MOS capacitors of size "128". By lowering the voltage at the gate of the summing cup ST to the reference voltage of "2048", they will flow, via a further threshold, into the MOS capacitors forming the decoder D if a larger amount of charge is in the summing cup ST than corresponds to the reference voltage at the area of the summing cup ST. A measure as to how much more charge is in the summing cup ST than has room in the 16 MOS capacitor of the decoder D with a reference voltage of "2048", is given by the number of the MOS capacitors "128" flooded by charge. Besides this CCD-related method, described in detail in German Published Non-Prosecuted Application (DE-OS) No. 27 04 711, the possibility, for example, of comparison with 16 reference voltages should be mentioned, which are graded in accordance to the significance of the digits of the binary number system.

A further CCD-related indication of the amount of charge in the summing cup ST, after it has been recognized that the "2048" level has been exceeded, is the addition of up to 16 charge packets with the charge volume "128" referred to the value "4096". A conclusion as to the size of the original charge packet in the summation cup ST is obtained from the necessary number of charge packets of volume "128" up to the point that the threshold "4096" is exceeded.

Reference voltages can be generated by bringing a defined charge packet of the smaller size to the reference value by the addition method in a definite number of steps, and then storing the resulting voltage value by means of a corresponding number of sample-and-hold members. The stored value must be renewed cyclically.

Then, the hereinabove-mentioned case (b) will also be described in greater detail, wherein the charge finds room in the space charge zone of the identification cup $IT_1$ or $IT_2$, respectively, which has been formed due to the gate voltage applied, without exceeding the threshold with its decision value "4096". It should be pointed out once more that the gate areas of the MOS capacitors $IT_1$ and $IT_2$, respectively, cover only one-sixteenth of the gate area of the second doubler cup VT* or the summing cup ST, and that no charge is transferred in the summing cup ST, contrary to the case (a) described above, which is recognized by the lack of response of the comparator $K_5$.

Also in case (b), the charge in the second doubler cup VT* is introduced in the manner previously described above. Then, the gates of $IT_1$ and $IT_2$ are connected to the gate of the second doubler cup VT*. For dosing or metering the amount of charge for the second doubler cup VT* then, the surface voltage in the indentification cup which had caused the comparator $K_2$ to respond, must be compared with a surface voltage of the threshold which is located between the identification cup and the summing cup ST. For this purpose, the comparators $K_3$ and $K_4$, respectively, can be utilized. Charge equality is ensured by the fact that the threshold $S_7$ between the second charge source $L_2$ and the second doubler cup VT*, and the thresholds $S_6$ and $S_7$ between the summing cup and the identification cups come from the same manufacturing process, and the gates formed are at the same voltage.

For the comparison process, the potential at the gate of the two identification cups $IT_1$ and $IT_2$ as well as at the gate of the second doubler cup VT* are shifted in direction toward the potential of the terminal of the semiconductor zone of the MOS cpacitors i.e. the voltage at these MOS capacitors is reduced. The charge, which can no longer be held in the doubler cup VT* due to the reduction of the space charge zone caused thereby, then flows back into the second charge source $L_2$. If the comparator $K_5$ detects equality, the lowering of the gate voltages is stopped. Then a charge six times larger than in the respective identification cup is stored in the second doubler cup VT* and is then refilled into the summing cup ST in the manner described hereinbefore. The charge present in the identification cup is then sucked away, to prepare the identification cup for the process of handling the next charge packet. The charge now in the summing cup ST is processed as in case a) in the manner described hereinabove.

The explanations heretofore are related to the construction of the semiconductor circuit in accordance with the invention as an analog-to-digital converter. Now the case of the construction as a digital-to-analog converter will be discussed.

In converting a digital signal into an analog signal, one starts with the smallest unit of a charge packet. This charge packet is added up as may times as required so that subsequently, being continuously added to itself, a charge corresponding to the analog value results. This charge packet is then converted into a voltage signal in an output diffusion zone, in a manner corresponding to the drain of an MOS transistor of the enhancement type. This voltage signal which is stored in a capacitor can then be shifted in accordance with the desired sign. The amounts of charge for the small signals are injected directly into the output diffusion zone, since they require no further processing.

In the simplest case, the digital signal to be processed can be used for building up the counter content of a digital counter and to generate with each counting pulse required therefor, a charge packet of the same size, which is then stored successively via the analog adder. The stored total charge corresponding to the digital signal is finally converted into a voltage forming the desired analog signal.

A particularly advantageous possibility will now be described with reference to FIG. 2. The digital-to-analog converter shown therein has an input section and a processing section. The processing section representing the analog adder AD has a charge source L*, which is separated by means of a threshold $P_1$ from an MOS capacitor V operating as a doubler cup. A further threshold $P_2$ is provided between the doubler cup V and the MOS capacitor SU serving as the summing cup.

The charge furnished in the input section by a charge source L is transferred via a threshold $P_3$ to a number of MOS capacitors BG of identical design, the so-called evaluation gates, which are constructed so that a charge transfer between the individual MOS capacitors BG is not directly possible because of the common threshold $P_4$ provided between them. In the manner evident from FIG. 2, the MOS capacitors BG are arranged in two parallel rows and the gate defining the threshold $P_4$ extends between the two rows as well as also between two adjacent MOS capacitors of each row. The common threshold $P_4$ furthermore controls the charge transfer from the community of the MOS capacitors BG into an identification cup C which is comparable to the identification cups $IT_1$, $IT_2$ of the analog-to-digital converter shown in FIG. 1. This identification cup C controls the charge transfer from the evaluation MOS capacitors BG into the summing cup SU with the aid of a further threshold $P_5$ located between it and the summing cup SU.

Finally, the identification cup C is provided with a probe $S^*_3$; the threshold $P_5$ between the identification cup and the summing cup SU with a probe $S_1^*$ for determining the surface potential $\phi s$.

They serve for addressing a comparator $K^*$ in a manner shown in FIG. 2. By means of the comparator $K^*$, the surface potential $\phi s$ at the threshold $P_5$ is compared in a manner controlled by a switch Sch with the surface potential at the summing cup SU or at the identification cup C.

It should further be mentioned that the area of the identification cup C is 1/16 of the area of the summing cup SU or the doubler cup V.

After appropriate processing and storing of the digital signal word, the last four bits, for example, are transmitted to the corresponding evaluation gates BG of the input section. The space charge zones formed thereby in the corresponding MOS capacitors BG are flooded by charges coming from the charge source L via the threshold $P_3$. After the voltage, at the charge source L, is lowered, excess charges flow back into the former. In addition, charges which have the magnitude "1" or "2" referred to the maximum charge "4032" remain in the MOS capacitors BG, which are addressed, for example, with the logical "1". By opening the threshold $P_4$, the charge from the MOS capacitors BG is sucked into the identification cup C and is added in the summing cup SU. If the voltages to be built up are small, these charges are sucked directly into an output diffusion zone acting as a drain (not shown). In the case of larger voltages, an addition process is first performed as in the case of the analog-to-digital conversion, which is controlled by the further bits of the digital signal word present. This purpose is served by the processing section AD i.e. the analog adder, which is represented by the doubler cup V, the summing cup SU, the charge source $L^*$ and the thresholds $P_1$ and $P_2$ located between these parts.

At the diffusion zone representing the output for the analog signal (not shown), the output signal is obtained in the usual manner as a voltage which can be taken off by means of an MOS field effect transistor. The output voltage of this transistor is stored in a capacitor. By leaving the content of this capacitor or shifting it, the signal is further influenced by the first bit of the digital signal word.

It is evident that in evaluating the charge transferred by the evaluation MOS capacitors BG to the identification cup C, also the case must be taken into consideration, wherein the mobile charge formed due to the space charge developed because of the voltage present at the gate of the identification cup has room in the identification cup without charge getting into the summing cup SU in the process and so, the comparator $K^*$ does not respond if it is connected to the probe $S^*_1$. This means, in other words, that the threshold $P_5$ with its decision value "4032" is not exceeded by the mobile charge in the MOS capacitor transferred to the identification cup C by the action represented by the digital word, on the evaluation MOS capacitors BG.

It is advisable to repeat feeding-in the charge from the input section into the identification cup at least once and to therefore perform a summation of charge in the identification cup C. In the doubler cup V, charge is introduced in the previously described manner. The gate of the identification cup C is connected to the gate of the doubler cup V. For dosing or metering the charge in the doubler cup V, the surface voltage in the identification cup C must then be compared with the surface voltage of the threshold $P_5$ in the comparator $K^*$. In a manner similar to the parallel case in operating the analog-to-digital converter according to FIG. 1, the gate voltage at the doubler cup V and at the identification cup C is reduced until the comparator C indicates the charge equality of the two MOS capacitors $K^*$ and V. ("Comparator C" should probably be comparator $K^*$). Then a charge sixteen-times as large as in the identification cup C is present in the doubler cup V; it is then fed for further evaluation in the manner previously described. The identification cup is then put in the state of readiness for receiving a new charge packet from the evaluation MOS capacitors BG by sucking away the charge.

Since the last-mentioned mode of operation of the digital-to-analog converter is identical with the mode of operation of the analog-to-digital converter and the gate areas are the same, the analog adder is used jointly, if conversion time is available.

Thus also the operation of a digital-to-analog converter according to the invention has been described.

In conclusion it should further be noted yet that the analog-to-digital conversion as well as the digital-to-analog conversion can be performed with clock widths of more than 10 nanoseconds and with comparator steps of more than 500 nanoseconds.

There are claimed:

1. Monolithically integrated semiconductor circuit with a signal input addressable by a first signal type, constituting analog signals, and with a signal output delivering a second signal type constituting digital signals, comprising a circuit section for converting the analog signals of the first signal type into the digital signals of the second signal type, said circuit section being a charge transport circuit forming an analog adder, the signal input addressable by an analog signal being connected via a sampler and a low-pass filter to a first MOS capacitor operated as a sample-and-hold member; a second MOS capacitor being connected to a third MOS capacitor connected, in turn, to a charge source, said first MOS capacitor and said third MOS capacitor having respective probes for determining the surface potential and for addressing a first comparator; said first MOS capacitor being connected to a fourth MOS capacitor which, in turn, is connected to said analog adder, said second MOS capacitor being connected to a fifth MOS capacitor which, in turn, is connected to said analog adder; said fourth and said fifth MOS capacitors having surface potentials serving for controlling a second comparator, said fourth MOS capacitor being provided for controlling a third comparator, and said fifth MOS capacitor being provided for controlling a fourth comparator; said fourth and said fifth MOS capacitors having equal area, said area being markedly smaller than that of all of the other MOS capacitors including the MOS capacitors of said analog adder.

2. Semiconductor circuit according to claim 1, wherein said first MOS capacitor and said MOS capacitors of said analog adder have equal area, and the area of said fourth and said fifth MOS capacitor is one-sixteenth of the area of said first MOS capacitor.

3. Semiconductor circuit according to claim 1, including a fifth comparator having an input addressable by the surface potential of said analog adder, said fifth comparator having another input controlled by the surface potential at the point of the threshold between said fourth MOS capacitor and said analog adder.

4. Method of operating a monolithically integrated semiconductor circuit with a signal input addressable by a first signal type, constituting analog signals, and with a signal output delivering a second signal type constituting digital signals, the circuit including a circuit section for converting the analog signals of the first signal type into the digital signals of the second signal type, said circuit section having a charge transport circuit forming an analog adder, the signal input addressable by an analog signal being connected via a sampler and a low-pass filter to a first MOS capacitor operated as a sample-and-hold member; a second MOS capacitor connected to a third MOS capacitor connected, in turn, to a charge source, said first MOS capacitor and said third MOS capacitor having respective probes for determining the surface potential and for addressing a first comparator; said first capacitor being connected to a fourth MOS capacitor which, in turn, is connected to said analog adder, said second MOS capacitor being connected to a fifth MOS capacitor which, in turn, is connected to said analog adder; said fourth and said fifth MOS capacitors having surface potentials serving for controlling a second comparator, said fourth MOS capacitor being provided for controlling a third comparator, and said fifth MOS capacitor being provided for controlling a fourth comparator; said fourth and said fifth MOS capacitors having equal area, said area being markedly smaller than that of all of the other MOS capacitors including the MOS capacitors of said analog adder, which comprises, immediately after the arrival of each charge packet at the first MOS capacitor, connecting the gate of the third MOS capacitor to the gate of the first MOS capacitor and, through the charge source and the threshold located between the charge source and the third MOS capacitor, producing in the third MOS capacitor an amount of charge equal to the sum of twice the base charge and the mobile charge adjusting itself for maximum signal amplitude in the first MOS capacitor, and then, with the threshold between the second and the third MOS capacitor open to the second MOS capacitor, transferring the amount of charge corresponding to the base charge from the third to the second MOS capacitor while lowering the voltage at the gate electrodes of the first and third MOS capacitors, and while connecting the gate electrode of the second MOS capacitor to the original potential of the first MOS capacitor.

5. Method of operating a semiconductor circuit according to claim 4, which comprises, after transferring the base charge from the third MOS capacitor to the second MOS capacitor while maintaining the potential at the gate of the second MOS capacitor, shifting the potential at the gate of the first MOS capacitor jointly with the potential at the gate of the third MOS capacitor (VT) in direction toward the potential of the terminal of the semiconductor zone forming the MOS capacitors, until the first comparator is responsive; when the first comparator responds, disconnecting the gate of the third MOS capacitor from the gate of the first MOS capacitor, and raising the potential of the gate of the first MOS capacitor again to the original value; tying the gates of the first MOS capacitor and the second MOS capacitor together and shifting the potential of the two gates in direction toward the terminal of the semiconductor zone of the MOS capacitors until the comparator associated with the fourth and the fifth MOS capacitor is responsive; and when this second comparator responds, holding fast the potential reached at the gates of the first MOS capacitor and the second MOS capacitor.

6. Method according to claim 5, which includes, upon response by the second comparator associated jointly with the fourth MOS capacitor and the fifth MOS capacitor, determining the MOS capacitor causing the response of the comparator because a charge was received and, on the basis of the result of this determination, storing a "1" or a "0" as the most significant bit for the output signal.

7. Method according to claim 5, which includes shifting the potential at the mutually connected gates of the first MOS capacitor and the second MOS capacitor further in direction toward the potential of the terminal of the semiconductor zone of the MOS capacitors until, from the group of the fourth MOS capacitor and the fifth MOS capacitor, the other MOS capacitor also begins to absorb charge from the MOS capacitor associated therewith from the group of the first MOS capacitor and the second MOS capacitor and, immediately after reaching this state, abruptly stopping the potential shift at the gates of the first and the second MOS capacitor again.

8. Method according to claim 7, which includes controlling a charge detection process by using the MOS capacitor which, of the group of the fourth and the fifth MOS capacitors, starts to accept charge last.

9. Method according to claim 7, which includes controlling a charge detection process by using the measuring probe causing the second comparator to respond again due to the start of this charge acceptance.

10. Method according to claim 8, which includes, with the second response of the comparator associated jointly with the fourth and the fifth MOS capacitor, terminating the charge acceptance of these MOS capacitors; then tying the gates of the fourth and the fifth MOS capacitor together and shifting the potentials thereof jointly in direction toward the potential of the terminal of the semiconductor zone forming the MOS capacitors, with the thresholds between the group of the fourth and the fifth MOS capacitor and the MOS capacitor forming at least part of the analog adder being open, until the entire charge in the fourth and fifth MOS capacitor, respectively, is transferred into the MOS capacitor of the analog adder.

11. Method according to claim 10, which includes connecting the thresholds located between the fourth and the fifth MOS capacitor, respectively, and the MOS capacitor forming at least part of the analog adder, and the threshold located between a second charge source and a second MOS capacitor of the analog adder to a common potential of the gate electrodes thereof.

12. Method according to claim 11, which includes introducing, at the second MOS capacitor of the analog adder, a charge proportional to the voltage at the gate of the second MOS capacitor of the analog adder, decreased by the voltage at the gate of the threshold located between the second charge source and the second MOS capacitor of the analog adder; lowering the voltage at the gate of the second MOS capacitor of the analog adder and, for this purpose, holding the threshold between the first and the second of the last-mentioned MOS capacitors open, so that charge passes from the second MOS capacitor of the analog adder to the first MOS capacitor of the analog adder.

13. Method according to claim 12, which includes, after transferring the charge of the second into the first MOS capacitor of the analog adder, again closing a threshold located between the first and second MOS capacitors of the analog adder and filling the second MOS capacitor of the analog adder again with charge.

14. Method according to claim 13, which includes evaluating the amount of charge transferred to the first MOS capacitor of the analog adder from at least the second MOS capacitor of the analog adder.

15. Monolithically integrated semiconductor circuit with a signal input addressable by a first signal type, constituting analog signals, and with a signal output delivering a second signal type constituting digital signals, comprising a circuit section for converting the analog signals of the first signal type into the digital signals of the second signal type, said circuit section being a charge transport circuit forming an analog adder, the signal input being addressable digitally and serving for building up the counter content of a digital counter controlled by counting pulses; and including means responsive to the counting pulses for building up and reducing this counter content for controlling the generation of charge packets of a CCD device containing an analog adder; and means responsive to the charge transferred in the process from the total quantity thereof to the analog adder for controlling the generation of a voltage proportional thereto.

16. Monolithically integrated semiconductor circuit with a signal input addressable by a first signal type, constituting analog signals, and with a signal output delivering a second signal type constituting digital signals, comprising a circuit section for converting the analog signals of the first signal type into the digital signals of the second signal type, said circuit section being charge transport circuit forming an analog adder, and further comprising an input section having a plurality of like MOS capacitors separated from one another by a first common threshold and from a common charge source by a second common threshold; said first common threshold being activatable for controlling charge transfer from a group of said like MOS capacitors to a further MOS capacitor representing the transmission to the analog adder and separated from the latter by a further threshold.

17. Semiconductor circuit according to claim 16, wherein said further threshold is inserted between the further MOS capacity causing the trasmission to the analog adder and a first MOS capacitor of the analog adder, and including probes for measuring surface potential and for controlling a common comparator, said probes respectively contacting the further MOS capacitor and said further threshold as well as said first MOS capacitor of the analog adder.

18. Semiconductor circuit according to claim 17, wherein said input section is controllable by the digitally addressed signal input and branches off a portion of the signal arriving for addressing the gates of part of said like MOS capacitors of the input section, the analog adder being controllable by the remainder of the signal.

19. Semiconductor circuit according to claim 18, wherein the MOS capacitors of the analog adder are defined by gate electrodes of equal area, and the further MOS capacitor causing the transmission between the input section and the analog adder is defined by a gate smaller by the factor 1/16 and, in comparison therewith, the gates of the like MOS capacitors in the input section having a smaller area yet.

* * * * *